(12) United States Patent
Yoo et al.

(10) Patent No.: US 10,604,980 B2
(45) Date of Patent: Mar. 31, 2020

(54) HINGE STRUCTURE AND ELECTRONIC DEVICE WITH THE SAME

(71) Applicant: Samsung Electronics Co., Ltd, Suwon-si (KR)

(72) Inventors: Chung Keun Yoo, Suwon-si (KR); Yong Hwa Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/230,742

(22) Filed: Dec. 21, 2018

(65) Prior Publication Data

US 2019/0194990 A1 Jun. 27, 2019

(30) Foreign Application Priority Data

Dec. 22, 2017 (KR) .................. 10-2017-0178675

(51) Int. Cl.
*E05D 11/00* (2006.01)
*H01R 35/04* (2006.01)
(Continued)

(52) U.S. Cl.
CPC ...... *E05D 11/0081* (2013.01); *E05D 11/0054* (2013.01); *H01R 35/04* (2013.01);
(Continued)

(58) Field of Classification Search
CPC . E05D 11/0081; E05D 11/0054; E05D 3/122; H01R 35/04; H05K 5/0247;
(Continued)

(56) References Cited

U.S. PATENT DOCUMENTS

| 7,512,426 B2 * | 3/2009 | Maatta ................ H04M 1/0218 16/354 |
| 2007/0054710 A1 * | 3/2007 | Pan ....................... H04M 1/022 455/575.3 |

(Continued)

FOREIGN PATENT DOCUMENTS

| KR | 100909713 B1 | 7/2009 |
| KR | 10-2009-0130445 A | 12/2009 |

(Continued)

OTHER PUBLICATIONS

International Search Report dated Mar. 5, 2019 in connection with International Patent Application No. PCT/KR2018/015840, 3 pages.
(Continued)

*Primary Examiner* — Rockshana D Chowdhury

(57) ABSTRACT

An electronic device may comprise a first housing structure including a first conductive part and a second housing structure including a second conductive part. The hinge structure may include a metallic bracket including a first conductive part and a second conductive part and a first cylindrical through hole and a second cylindrical through hole, a first cylindrical insulating bushing at least partially positioned inside the first through hole, a second cylindrical insulating bushing at least partially positioned inside the second through hole, a first conductive shaft contacting the first conductive part and extending through the first insulating bushing, a second conductive shaft contacting the second conductive part and extending through the second insulating bushing, and a conductive connector contacting the first conductive shaft and the second conductive shaft and configured to form an electrical path from the first conductive part to the second conductive part.

19 Claims, 13 Drawing Sheets

(51) Int. Cl.
  *H05K 5/04* (2006.01)
  *H05K 5/02* (2006.01)
  *H05K 5/00* (2006.01)
  *H05K 7/14* (2006.01)
  *H04M 1/02* (2006.01)
  *E05D 3/12* (2006.01)

(52) U.S. Cl.
  CPC .......... *H04M 1/022* (2013.01); *H05K 5/0017* (2013.01); *H05K 5/0217* (2013.01); *H05K 5/0226* (2013.01); *H05K 5/0247* (2013.01); *H05K 5/04* (2013.01); *H05K 7/1427* (2013.01); *E05D 3/122* (2013.01); *E05Y 2900/606* (2013.01)

(58) Field of Classification Search
  CPC .. H05K 7/1427; H05K 5/0017; H05K 5/0226; H05K 5/04; H05K 5/0217; H04M 1/022; E05Y 2900/606
  See application file for complete search history.

(56) References Cited

U.S. PATENT DOCUMENTS

2012/0309470 A1   12/2012   Park et al.
2013/0152342 A1   6/2013   Ahn et al.
2014/0220790 A1*  8/2014   Lee .................... E05D 11/0081
                                                439/31

FOREIGN PATENT DOCUMENTS

KR   10-2010-0020133 A   2/2010
KR   10-2010-0042858 A   4/2010

OTHER PUBLICATIONS

Written Opinion of the International Searching Authority dated Mar. 5, 2019 in connection with International Patent Application No. PCT/KR2018/015840, 4 pages.

* cited by examiner

HINGE STRUCTURE AND ELECTRONIC DEVICE WITH THE SAME

CROSS-REFERENCE TO RELATED APPLICATIONS

This application is based on and claims priority under 35 U.S.C. § 119 to Korean Patent Application No. 10-2017-0178675 filed on Dec. 22, 2017 in the Korean Intellectual Property Office, the disclosure of which is incorporated by reference herein in its entirety.

BACKGROUND

1. Field

Various embodiments of the disclosure relate to hinge structures and electronic devices including the same.

2. Description of Related Art

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation device for an automobile, etc. For example, electronic devices may output stored information as voices or images. As electronic devices are highly integrated, and high-speed, high-volume wireless communication becomes commonplace, electronic devices, such as a mobile communication terminal, have recently been equipped with various functions. For example, an electronic device comes with integrated functionality, including entertainment functions, such as playing video games, multimedia functions, such as replaying music/videos, communication and security functions for mobile banking, and scheduling or e-wallet functions.

An electronic device may include an input device-based main body part, a display device-based display part, and various types of connecting structures for interconnecting the main body part and the display part. For example, the connecting structures may come in rotation types, sliding types, and swing types. Swing-type connecting structures may have a hinge and may be adopted for electronic devices thanks to their ability to be easily manufactured, their reduced defect rate, and their convenience in use.

A hinge structure used in an electronic device to connect a main body part and a display part may include a conductive hinge shaft, a bracket, and a cover. The conductive frame of the display part and the main body part is connected to one side of the hinge shaft. The bracket and the cover, which are joined to the bracket via, e.g., a screw, are connected with a portion of the opposite side of the hinge shaft.

When an electric current flows through the main body part and the display part, the electric current may flow through the hinge shaft, bracket, and screw, which are electrically connected thereto, down to the cover, which is disposed on the outer surface. The cover of the hinge structure may be insulated due to its surface being coated with paint. However, if the paint coating peels off due to, e.g., scratches, current flow may be created through the cover. Such current flow may cause an electric shock to the user, e.g., upon charging the electronic device.

As another example, when the main body part and the display part of the electronic device are produced to be electrically independent from each other, the printed circuit board embedded in the main body part may be vulnerable to electrostatic discharge (ESD) or electric shocks due to the shrunken ground. The shrunken ground may also weaken the resistance of the printed circuit board in the display part to ESD or electric shocks.

The above information is presented as background information only to assist with an understanding of the disclosure. No determination has been made, and no assertion is made, as to whether any of the above might be applicable as prior art with regard to the disclosure.

SUMMARY

According to various embodiments of the disclosure, the case, which comes in direct contact with the user's skin, is configured to be insulated, thereby preventing electric shocks or other dangerous situations that the user may encounter when using the electronic device while charging the electronic device.

According to various embodiments of the disclosure, the case of the hinge structure may be insulated, and the hinge shafts may be interconnected, thereby providing a sufficient ground capacity for the printed circuit boards disposed in the main body part and/or the display part. The sufficient ground capacity allows for efficient hardware (H/W) capability (e.g., satisfactory ESD or wireless communication sensitivity) of the electronic device.

In accordance with an embodiment of the disclosure, an electronic device may comprise a first housing structure including a first conductive part and a second housing structure including a second conductive part. The hinge structure may include a metallic bracket including a first conductive part and a second conductive part and a first cylindrical through hole and a second cylindrical through hole, a first cylindrical insulating bushing at least partially positioned inside the first through hole, a second cylindrical insulating bushing at least partially positioned inside the second through hole, a first conductive shaft contacting the first conductive part and extending through the first insulating bushing, a second conductive shaft contacting the second conductive part and extending through the second insulating bushing, and a conductive connector contacting the first conductive shaft and the second conductive shaft and configured to form an electrical path from the first conductive part through the first conductive shaft, the conductive connector, and the second conductive shaft to the second conductive part.

In accordance with an embodiment of the disclosure, an electronic device may comprise a first housing, a second housing, and a hinge structure rotatably connecting the first housing with the second housing. The hinge structure may include a metallic bracket including a first conductive part and a second conductive part and at least one through hole, a conductive shaft passing through the at least one through hole of the metallic bracket and connected with the first conductive part or the second conductive part, and an insulating bushing disposed between at least a portion of the conductive shaft and the through hole of the metallic bracket and configured to insulate the conductive shaft from the metallic bracket.

In accordance with an embodiment of the disclosure, an electronic device may comprise a first housing, a second housing, and a hinge structure rotatably connecting the first housing with the second housing. The hinge structure may include a metallic bracket including a first conductive part and a second conductive part and a first through hole and a second through hole, a first conductive shaft passing through the first through hole of the metallic bracket and connected with the first conductive part, a second conductive shaft passing through the second through hole of the metallic bracket and connected with the second conductive part, and a conductive connector contacting the first conductive shaft and the second conductive shaft and electrically connecting the first conductive shaft with the second conductive shaft.

In accordance with an embodiment of the disclosure, a hinge structure may comprise a metallic bracket including a first cylindrical through hole and a second cylindrical through hole, a first cylindrical insulating bushing at least partially positioned inside the first through hole, a second cylindrical insulating bushing at least partially positioned inside the second through hole, a first conductive shaft extending through the first insulating bushing, a second conductive shaft extending through the second insulating bushing, and a conductive connector contacting the first conductive shaft and the second conductive shaft and configured to form an electrical path through the first conductive shaft, the conductive connector, and the second conductive shaft.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components, and structures.

DETAILED DESCRIPTION

Figure 1:
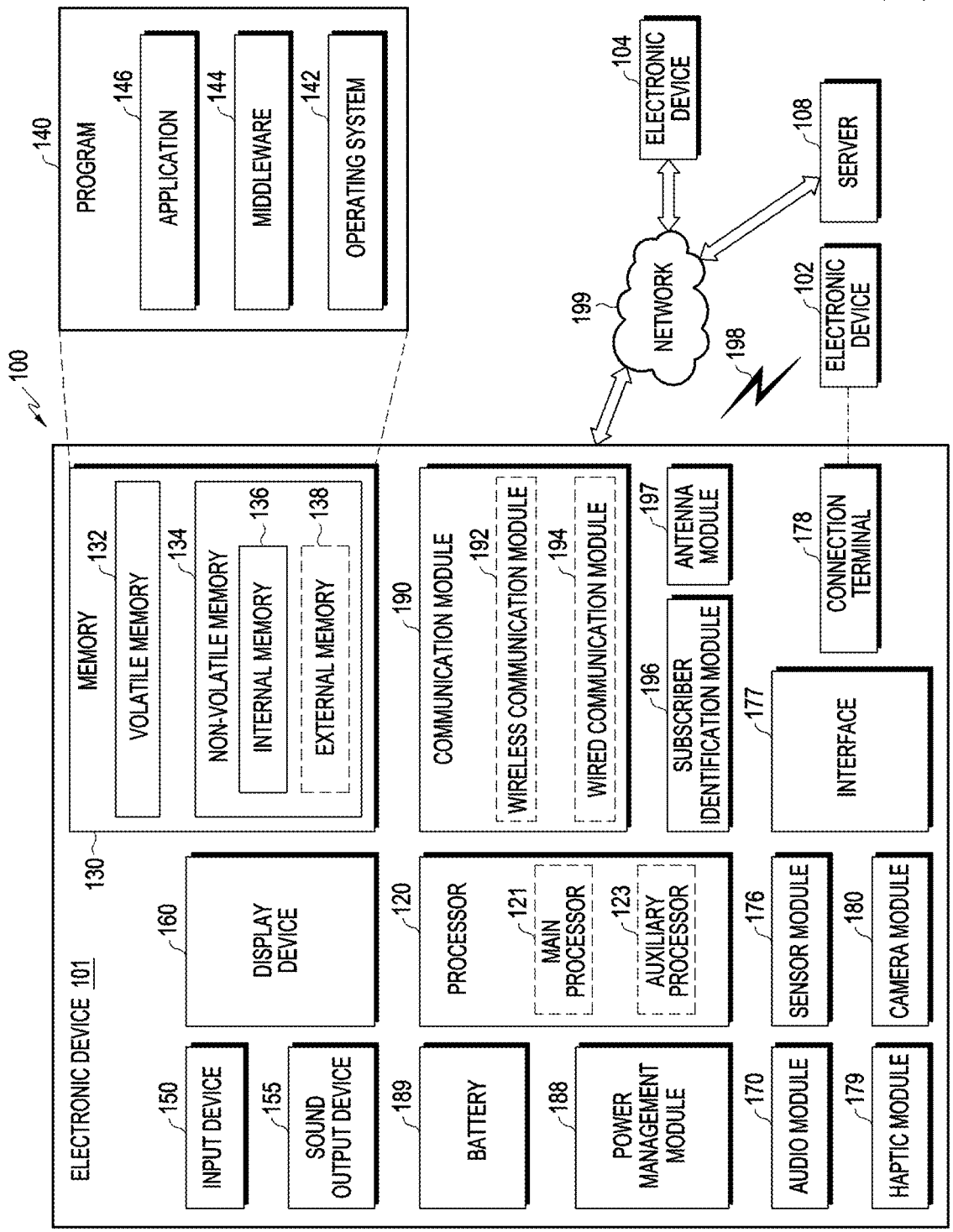
FIG. 1 is a block diagram illustrating an electronic device 101 in a network environment 100 according to various embodiments.

FIGS. 1 through 16, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The electronic device according to various embodiments may be one of various types of electronic devices. The electronic devices may include at least one of, e.g., a portable communication device (e.g., a smartphone), a computer device, a portable multimedia device, a portable medical device, a camera, a wearable device, or a home appliance. According to an embodiment of the disclosure, the electronic device is not limited to the above-listed embodiments.

It should be appreciated that various embodiments of the disclosure and the terms used therein are not intended to limit the techniques set forth herein to particular embodiments and that various changes, equivalents, and/or replacements therefor also fall within the scope of the disclosure. The same or similar reference denotations may be used to refer to the same or similar elements throughout the specification and the drawings. It is to be understood that the singular forms "a," "an," and "the" include plural references unless the context clearly dictates otherwise. As used herein, the term "A or B," "at least one of A and/or B," "A, B, or C," or "at least one of A, B, and/or C" may include all possible combinations of the enumerated items. As used herein, the terms "1st" or "first" and "2nd" or "second" may modify corresponding components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the term "module" includes a unit configured in hardware, software, or firmware and may interchangeably be used with other terms, e.g., "logic," "logic block," "part," or "circuit." A module may be a single integral part or a minimum unit or part for performing one or more functions. For example, the module may be configured in an application-specific integrated circuit (ASIC).

Various embodiments as set forth herein may be implemented as software (e.g., the program 140) containing commands that are stored in a machine (e.g., computer)-readable storage medium (e.g., an internal memory 136) or an external memory 138. The machine may be a device that may invoke a command stored in the storage medium and may be operated as per the invoked command. The machine may include an electronic device (e.g., the electronic device 101) according to embodiments disclosed herein. When the command is executed by a processor (e.g., the processor 120), the processor may perform a function corresponding to the command on its own or using other components under the control of the processor. The command may contain a code that is generated or executed by a compiler or an interpreter. The machine-readable storage medium may be provided in the form of a non-transitory storage medium. Here, the term "non-transitory" simply means that the storage medium does not include a signal and is tangible, but this term does not differentiate between where data is semipermanently stored in the storage medium and where data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., a compact disc read only memory (CD-ROM)) or online through an application store (e.g., Playstore™). When distributed online, at least part of the computer program product may be temporarily generated or at least temporarily stored in a storage medium, such as the manufacturer's server, a server of the application store, or a relay server.

According to various embodiments, each component (e.g., a module or program) may be configured of a single or multiple entities, and the various embodiments may exclude some of the above-described sub components or add other sub components. Alternatively or additionally, some components (e.g., modules or programs) may be integrated into a single entity that may then perform the respective (pre-integration) functions of the components in the same or similar manner. According to various embodiments, operations performed by modules, programs, or other components may be carried out sequentially, in parallel, repeatedly, or heuristically, or at least some operations may be executed in a different order or omitted, or other operations may be added. Hereinafter, electronic devices are described with reference to the accompanying drawings, according to various embodiments of the disclosure. As used herein, the term "user" may denote a human or another device (e.g., an artificial intelligent electronic device) using the electronic device.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera assembly 180, a power management module 188, a battery 189, a communication module 190, a subscriber identification module (SIM) 196, or an antenna module 197. In some embodiments, the electronic device 101 may exclude at least one (e.g., the display device 160 or the camera assembly 180) of the components or add other components. In some embodiments, some components may be implemented to be integrated together, e.g., as if the sensor module 176 (e.g., a fingerprint sensor, an iris sensor, or an illuminance sensor) is embedded in the display device (160) (e.g., a display).

The processor 120 may drive, e.g., software (e.g., a program 140) to control at least one other component (e.g., a hardware or software component) of the electronic device 101 connected with the processor 120 and may process or compute various data. The processor 120 may load and process a command or data received from another component (e.g., the sensor module 176 or the communication module 190) on a volatile memory 132, and the processor 120 may store resultant data in a non-volatile memory 134. According to an embodiment, the processor 120 may include a main processor 121 (e.g., a central processing unit (CPU) or an application processor), and additionally or alternatively, an auxiliary processor 123 (e.g., a graphics processing unit (GPU), an image signal processor, a sensor hub processor, or a communication processor) that is operated independently from the main processor 121 and that consumes less power than the main processor 121 or is specified for a designated function. Here, the auxiliary processor 123 may be operated separately from or embedded in the main processor 121.

In such case, the auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., performing an application). According to an embodiment, the auxiliary processor 123 (e.g., an image signal processor or a communication processor) may be implemented as part of another component (e.g., the camera assembly 180 or the communication module 190) functionally related to the auxiliary processor 123. The memory 130 may store various data used by at least one component (e.g., the processor 120) of the electronic device 101, e.g., software (e.g., the program 140) and input data or output data for a command related to the software. The memory 130 may include the volatile memory 132 or the non-volatile memory 134.

The program 140, as software stored in the memory 130, may include, e.g., an operating system (OS) 142, middleware 144, or an application 146.

The input device 150 may be a device for receiving a command or data, which is to be used for a component (e.g., the processor 120) of the electronic device 101, from an outside (e.g., a user) of the electronic device 101. The input device 50 may include, e.g., a microphone, a mouse, or a keyboard.

The sound output device 155 may be a device for outputting sound signals to the outside of the electronic device 101. The sound output device 155 may include, e.g., a speaker which is used for general purposes, such as playing multimedia or recording and playing, and a receiver used for call receiving purposes. According to an embodiment, the receiver may be formed integrally or separately from the speaker.

The display 160 may be a device for visually providing information to a user of the electronic device 101. The display device 160 may include, e.g., a display, a hologram device, or a projector and a control circuit for controlling the display, hologram device, or projector. According to an embodiment, the display device 160 may include touch circuitry or a pressure sensor capable of measuring the strength of a pressure for a touch.

The audio module 170 may convert a sound into an electrical signal and vice versa. According to an embodiment, the audio module 170 may obtain a sound through the input device 150 or output a sound through the sound output device 155 or an external electronic device (e.g., an electronic device 102 (e.g., a speaker or a headphone) wiredly or wirelessly connected with the electronic device 101.

The sensor module 176 may generate an electrical signal or data value corresponding to an internal operating state (e.g., power or temperature) or external environmental state of the electronic device 101. The sensor module 176 may include, e.g., a gesture sensor, a gyro sensor, an atmospheric pressure sensor, a magnetic sensor, an acceleration sensor, a grip sensor, a proximity sensor, a color sensor, an infrared (IR) sensor, a bio sensor, a temperature sensor, a humidity sensor, or an illuminance sensor.

The interface 177 may support a designated protocol enabling a wired or wireless connection with an external electronic device (e.g., the electronic device 102). According to an embodiment, the interface 177 may include a high definition multimedia interface (HDMI), a universal serial bus (USB) interface, a secure digital (SD) card interface, or an audio interface.

A connecting terminal 178 may include a connector, e.g., an HDMI connector, a USB connector, an SD card connector, or an audio connector (e.g., a headphone connector), which is able to physically connect the electronic device 101 with an external electronic device (e.g., the electronic device 102).

The haptic module 179 may convert an electrical signal into a mechanical stimulus (e.g., a vibration or motion) or electrical stimulus which may be recognized by a user via his tactile sensation or kinesthetic sensation. The haptic module 179 may include, e.g., a motor, a piezoelectric element, or an electric stimulator.

The camera assembly 180 may capture a still image or moving images. According to an embodiment, the camera assembly 180 may include one or more lenses, an image sensor, an image signal processor, or a flash.

The power management module 188 may be a module for managing power supplied to the electronic device 101. The power management module 188 may be configured as at least part of, e.g., a power management integrated circuit (PMIC).

The battery 189 may be a device for supplying power to at least one component of the electronic device 101. The battery 189 may include, e.g., a primary cell which is not rechargeable, a secondary cell which is rechargeable, or a fuel cell.

The communication module 190 may support establishing a wired or wireless communication channel between the electronic device 101 and an external electronic device (e.g., the electronic device 102, the electronic device 104, or the server 108) and performing communication through the established communication channel. The communication module 190 may include one or more communication processors that are operated independently from the processor 120 (e.g., an application processor) and supports wired or wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of the wireless communication module 192 and the wired communication module 194 may be used to communicate with an external electronic device through a first network 198 (e.g., a short-range communication network, such as Bluetooth, wireless-fidelity (Wi-Fi) direct, or infrared data association (IrDA)) or a second network 199 (e.g., a long-range communication network, such as a cellular network, the Internet, or a communication network (e.g., LAN or wide area network (WAN)). The above-enumerated types of communication modules 190 may be implemented in a single chip or individually in separate chips.

According to an embodiment, the wireless communication module 192 may differentiate and authenticate the electronic device 101 in the communication network using user information stored in the subscriber identification module 196.

The antenna module 197 may include one or more antennas for transmitting or receiving a signal or power to/from an outside. According to an embodiment, the communication module 190 (e.g., the wireless communication module 192) may transmit or receive a signal to/from an external electronic device through an antenna appropriate for a communication scheme.

Some of the above-described components may be connected together through an inter-peripheral communication scheme (e.g., a bus, general purpose input/output (GPIO), serial peripheral interface (SPI), or mobile industry processor interface (MIPI)), communicating signals (e.g., commands or data) therebetween.

According to an embodiment, commands or data may be transmitted or received between the electronic device 101 and the external electronic device 104 via the server 108 coupled with the second network 199. The first and second external electronic devices 102 and 104 each may be a device of the same or a different type from the electronic device 101. According to an embodiment, all or some of operations executed on the electronic device 101 may be run on one or more other external electronic devices. According to an embodiment, when the electronic device 101 should perform a certain function or service automatically or at a request, the electronic device 101, instead of, or in addition to, executing the function or service on its own, may request an external electronic device to perform at least some functions associated therewith. The external electronic device receiving the request may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

Figure 2:
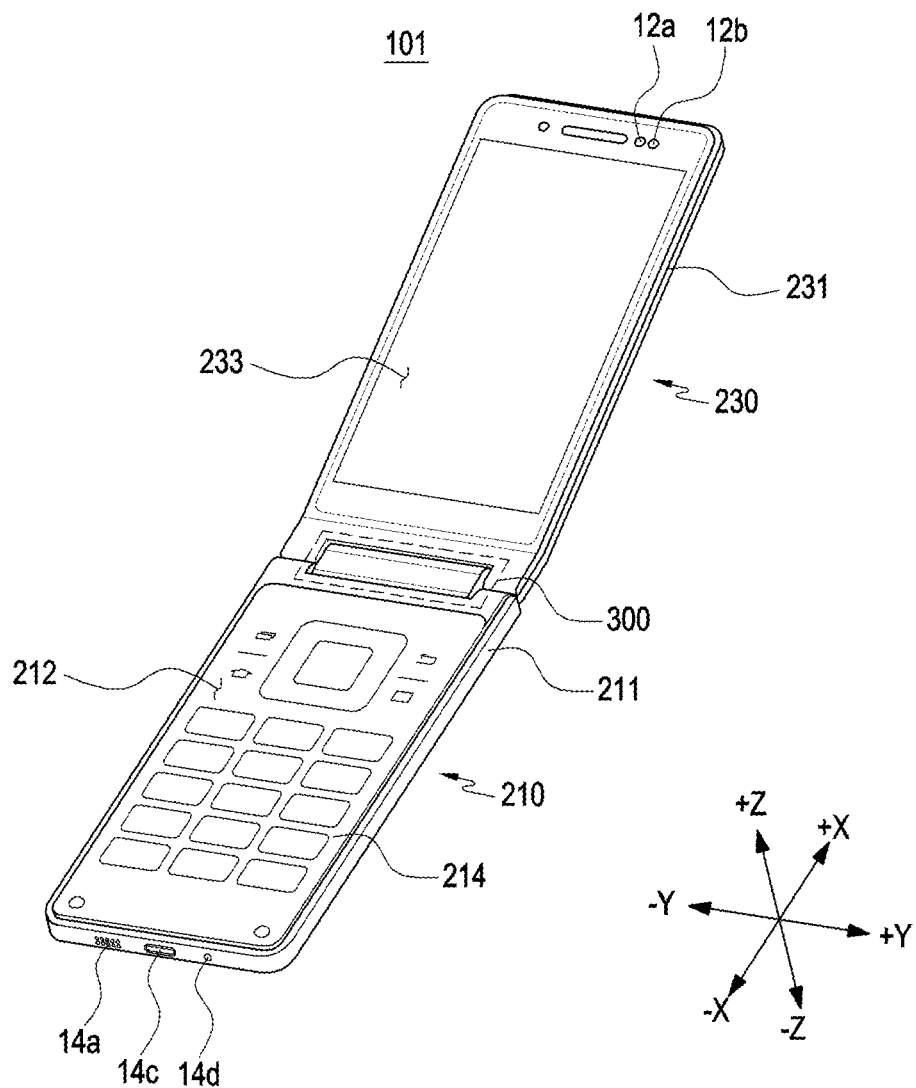
FIG. 2 is a perspective view illustrating an electronic device 101 in an unfolded position according to an embodiment.
Figure 3:
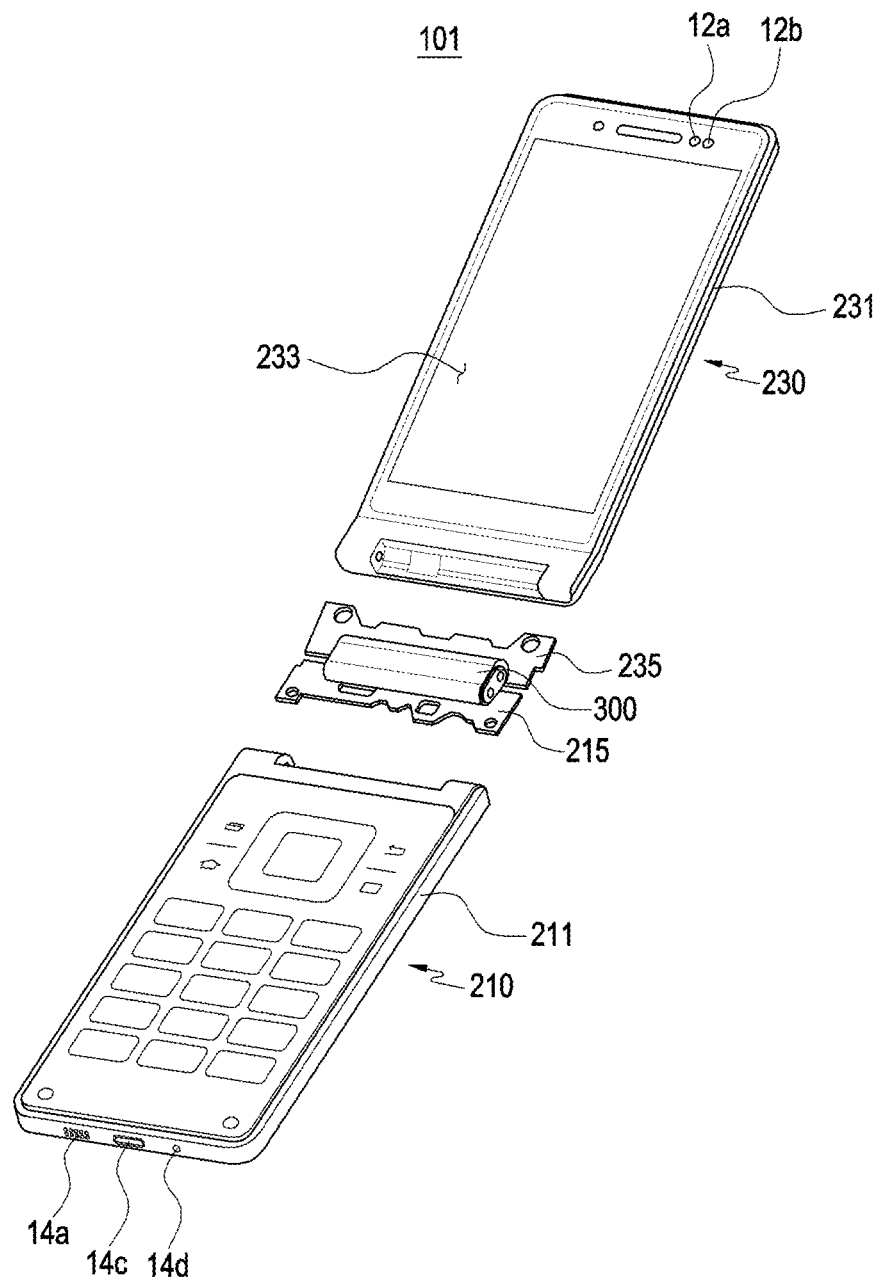
FIG. 3 is a perspective view illustrating a state of an electronic device 101 in which a hinge structure of the electronic device 101 is separated according to an embodiment.

FIG. 2 is a perspective view illustrating an electronic device 101 in an unfolded position according to an embodiment. FIG. 3 is a perspective view illustrating a state of an electronic device 101 in which a hinge structure 300 of the electronic device 101 is separated according to an embodiment.

Referring to FIGS. 2 and 3, according to an embodiment, an electronic device 101 may include a main body part 210, a display part 230, and a hinge structure 300.

According to an embodiment, the electronic device 101 may include the main body part 210 and the display part 230 that may be electrically connected with the main body part 210 via the hinge structure 300 disposed in the main body part 210. The hinge structure 300 may be a structure with some components that correspond to the rotation of the display part 230 about the main body part 210 and may be disposed in, at least, a portion of the main body part 210 and the display part 230.

In the three-axis rectangular coordinate system as shown in FIG. 2, 'X,' 'Y,' and 'Z,' respectively, may denote the length, width, and thickness direction of the main body part 210 of the electronic device. According to an embodiment of the disclosure, 'Z' may mean a first direction (+Z) or a second direction (−Z).

According to an embodiment, the main body part 210 may include a data input unit 214. For example, the data input unit 214 may be a keypad device that assists in input tasks, e.g., typing, in order to transfer data to the main body part 210. For example, the main body part 210 may include a first housing 211 and a plurality of input keys in a portion of the top surface 212 facing in the first direction +Z of the first housing 211. The user may enter data, which is to be displayed on the display part 230 or stored, using the data input unit 214 in a quick and convenient way.

According to an embodiment, in an end of the first housing 211, there may be a speaker hole 14a, an earphone jack hole 14d, and an electrical connector 14c (e.g., a charging terminal hole) for connection to the outside of, e.g., a speaker (spk) enclosure, an earphone jack, and a charging terminal, embedded in the main body part 210.

According to an embodiment, the first housing 211 may be an element for receiving various electronic parts. At least part of the first housing 211 may be formed of a conductive material. For example, the first housing 211 may have side walls forming outer side surfaces of the main body part 210. Portions of the main body part 210, which are exposed to the outside, may be formed of a metal. Inside the first housing 211, a printed circuit board part (e.g., the main printed circuit board 213 of FIG. 4) and/or a battery (e.g., the battery 217 of FIG. 4) may be received.

According to an embodiment, the display part 230 may include a second housing 231 with a transparent cover 233. Inside the second housing 231 may be placed a display device (e.g., the display device 160 of FIG. 1 or a display) to display information to the outside through the transparent cover 233.

According to an embodiment, the display part 230 may include a device configured as a means of image display. The display part 230 may include a data input unit, a data output unit, and/or a data input/output unit. For example, the data input unit may be an input device such as a touchpad, and the data output unit may be a display unit such as a display device. The data input/output unit may be a device such as a touchscreen.

According to an embodiment, the data input pad may include a keypad with buttons, or a touchpad to transfer signals to a portion (e.g., a bezel portion or a portion overlapping the display device) of the transparent cover on the front surface of the second housing 231. The touchpad may generate input signals by contacting the user's body. According to an embodiment, the touchpad may be implemented with only mechanical buttons or only touch keys. As another example, the touchpad may be implemented as a mixed type of the mechanical button type and the touch type. The touchpad may provide various screens on the display corresponding to a shorter or longer press or touch of the buttons.

According to an embodiment, the second housing 231 of the display part 230 may be an element for receiving various electronic parts. At least part of the second housing 231 may be formed of a conductive material. For example, the second housing 221 may have side walls forming outer side surfaces of the display part 230. Portions of the display part 230, which are exposed to the outside, may be formed of a metal. Inside the display part 230 a printed circuit board part may be received (e.g., the sub printed circuit board 237 of FIG. 4). As another example, in a front top area of the second housing 231, a first camera 12, a light source unit 12b, or an iris camera (not shown) may be included. For example, the light source unit 12b may be an infrared (IR) light emitting diode (LED). The iris camera may take an image of the user's eye using, as a light source, near infrared light emitted from the IR LED, thereby recognizing iris information. As another example, although not shown, a lamp, an illuminance sensor, or a proximity sensor may be included in the front top area of the electronic device 200. As yet another example, although not shown, a second camera, a heart rate monitor (HRM), or a flash may be included in a rear surface area of the second housing 231.

According to an embodiment, a hinge structure 300 may be disposed on a side of the main body part 210 and on a side of the display part 230 in order to electrically connect the main body part 210 with the display part 230. The hinge structure 300 may include a first conductive part 215 and a second conductive part 235. An end of the first conductive part 215 may be connected to the first housing 211, and an end of the second conductive part 235 may be connected to the second housing 231.

The hinge structure 300 is described below in greater detail according to various embodiments.

Figure 4:
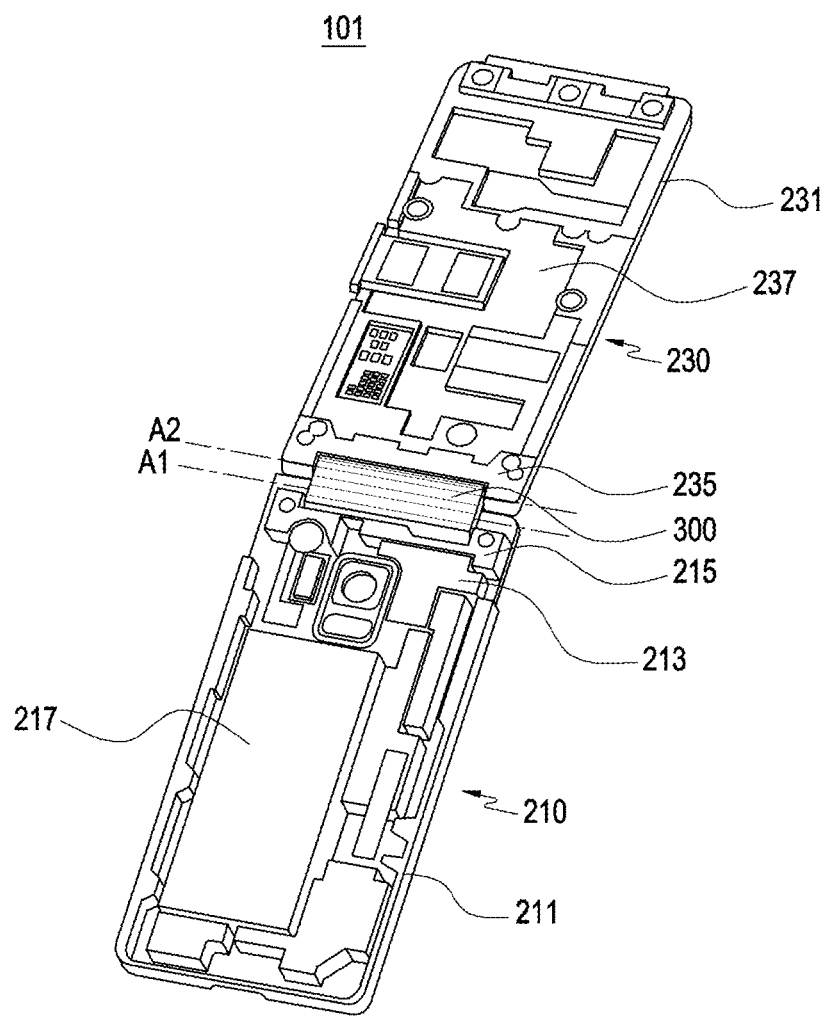
FIG. 4 is a perspective view illustrating internal parts of an electronic device 101 according to an embodiment.

FIG. 4 is a perspective view illustrating internal parts of an electronic device 101 according to an embodiment.

Referring to FIG. 4, the electronic device 101 may include a first housing 211, a second housing 231, and a hinge structure 300. The hinge structure 300 may couple the first housing 211 and the second housing 231 so as to be rotatable with respect to each other.

The structure of the first housing 211, the second housing 231, and the hinge structure 300 of the electronic device 101 shown in FIG. 4 may be the same, in whole or in part, as the structure of the first housing 211, the second housing 231, and the hinge structure 300 of the electronic device 101 shown in FIGS. 2 and 3.

According to an embodiment, the second housing 231 of the electronic device 101 may rotate about the first housing 211 in a range of 0 degrees to 180 degrees. As the second housing 231 is positioned at 0 degrees about the first housing 211, such that the electronic device 101 is in a folded position, the front surface of the first housing 211 may face the front surface of the second housing 231. As the second housing 231 rotates 180 degrees about the first housing 211, such that the electronic device 101 is unfolded, the front surface of the first housing 211 and the front surface of the second housing 231 may be positioned to face the same direction. However, the rotation of the second housing 231 about the first housing 211 in the electronic device 101 is not limited to an angle ranging from 0 degrees to 180 degrees, but may rather be performed at various angles within 360 degrees.

According to an embodiment, the hinge structure 300 disposed at the respective sides of the first housing 211 and the second housing 231 may provide a first virtual rotational axis A1 about which the first housing 211 rotates and a second virtual rotational axis A2 about which the second housing 231 rotates.

According to an embodiment, the first housing 211 of the main body part 210 may be an element for receiving various electronic parts. At least part of the second housing 231 may be formed of a conductive material. A main printed circuit board 213 and/or a battery 217 may be received inside the first housing 211.

According to an embodiment, the second housing 231 of the display part 230 may be an element for receiving various electronic parts. At least part of the second housing 231 may be formed of a conductive material. A sub printed circuit board 237 may be received inside the second housing 231.

According to an embodiment, the main printed circuit board 213 and/or the sub printed circuit board 237 may have a circuit of the terminal, e.g., at least one of an application processor (AP), a communication processor (CP), a memory, and a radio frequency (RF) transceiver, and signal lines (e.g., RF signal lines) mounted thereon. For example, a processor (e.g., the processor 120 of FIG. 1), a communication module (e.g., the communication module 190 of FIG. 1), various interfaces (e.g., the interface 177 of FIG. 1), and a power management module (e.g., the power management module 188 of FIG. 1) may be mounted on the main printed circuit board 213 in the form of an integrated circuit (IC) chip. For example, a control circuit may also be configured in an IC chip and mounted on the printed circuit board. For example, the control circuit may be part of the processor or the communication module.

According to an embodiment, the battery 217 may be a device for supplying power to at least one component of the electronic device 101. The battery 189 may include, e.g., a primary cell which is not rechargeable, a secondary cell which is rechargeable, or a fuel cell. The battery 217 may be charged wiredly via an electrical connector (e.g., the electrical connector 14c of FIGS. 2 and 3) or wirelessly via a wireless charging antenna (e.g., the antenna module 197 of FIG. 1). At least a portion of the battery 217 may be disposed on substantially the same plane as, e.g., the main printed circuit board 213. The battery 217 may be integrated or detachably disposed inside the electronic device 101.

According to an embodiment, the electronic device 101 may include an antenna (e.g., the antenna module 197 of FIG. 1). The antenna may include, e.g., a near-field communication (NFC) antenna, a wireless charging antenna, and/or a magnetic secure transmission (MST) antenna. The antenna may perform short-range communication with, e.g., an external device or may wirelessly transmit or receive power necessary for charging. Alternatively, an antenna structure may be formed by part, or a combination, of the side surface structure of the first housing 211 and/or the second housing 231.

Figure 5:
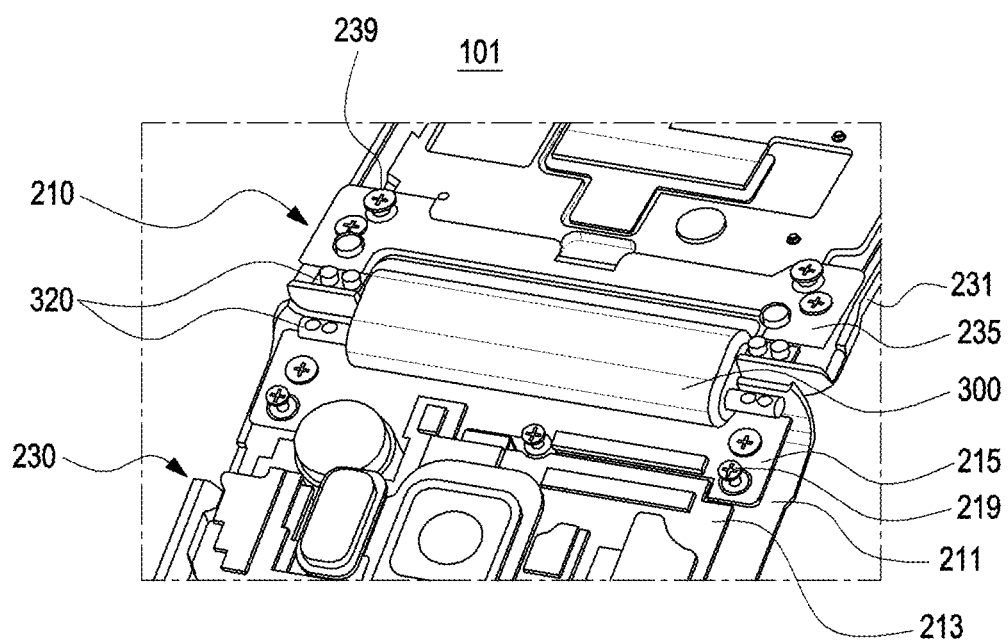
FIG. 5 is a view illustrating a hinge structure 300 and its surrounding area in an electronic device 101 according to an embodiment.

FIG. 5 is a view illustrating a hinge structure 300 and its surrounding area in an electronic device according to an embodiment.

Referring to FIG. 5, according to an embodiment of the disclosure, an electronic device 101 may include a first housing 211, a second housing 231, and a hinge structure 300. The hinge structure 300 may couple the first housing 211 and the second housing 231 so as to be rotatable about each other. For example, the first housing 211 may be folded or unfolded on the second housing 231. As another example, the second housing 231 may be folded or unfolded on the first housing 211.

The first housing 211, the second housing 231, and the hinge structure 300 of the electronic device shown in FIG. 5 may be the same, in whole or in part, as the first housing 211, the second housing 231, and the hinge structure 300 of the electronic device shown in FIG. 4.

According to an embodiment, the first housing 211 may be coupled with a portion of the hinge structure 300 via a first conductive part 215 of the hinge structure 300. As another example, the second housing 231 may be coupled with another portion of the hinge structure 300 via a second conductive part 235 of the hinge structure 300. For example, a portion of the first conductive part 215 may be coupled with at least one shaft of the hinge structure 300, and another portion of the first conductive part 215 may be connected to a surface of the first housing 211 via a coupling member 219, e.g., a screw. As another example, a portion of the second conductive part 235 may be coupled with at least one shaft of the hinge structure 300, and another portion of the second conductive part 235 may be connected to a surface of the second housing 231 via a coupling member 239, e.g., a screw.

Figure 6:
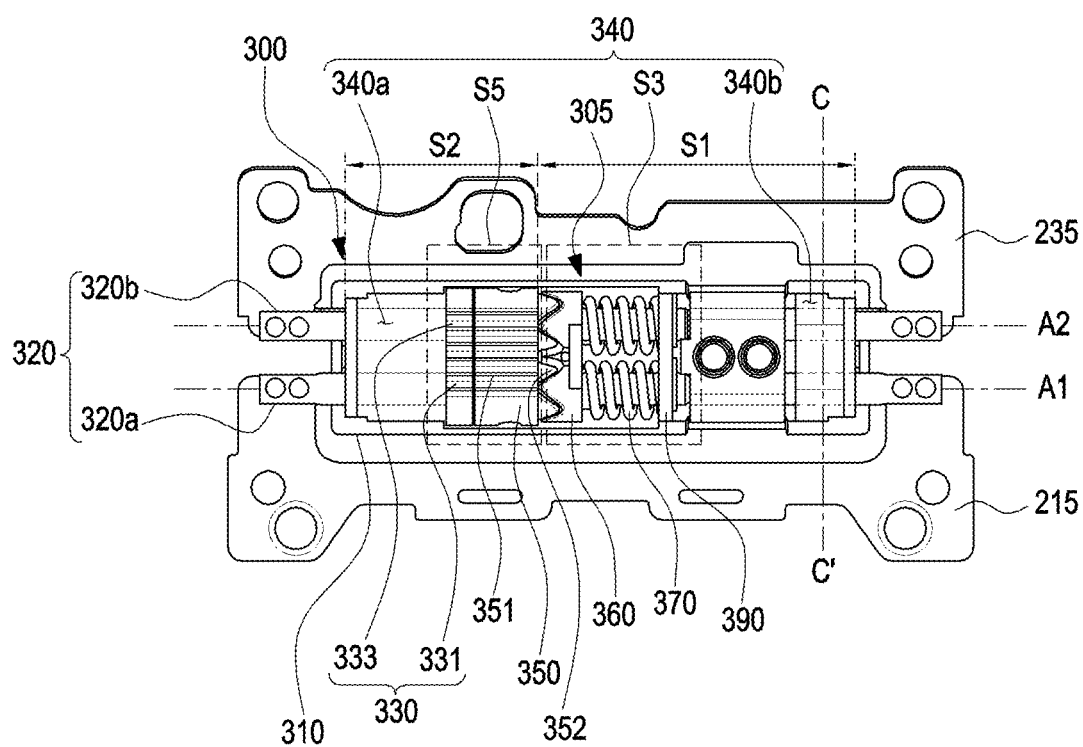
FIG. 6 is an enlarged view illustrating an internal configuration of a hinge structure 300 as shown in FIG. 5 according to an embodiment.

FIG. 6 is an enlarged view illustrating the internal configuration of a hinge structure 300 as shown in FIG. 5 according to an embodiment.

Referring to FIG. 6, a hinge structure 300 may be configured in a double-shaft structure and may include a hinge case 310, at least one metallic bracket 340, conductive shafts 320, insulating bushings (not shown), and a conductive connector 390. As another example, the hinge structure 300 may include a stopper cam 350 with at least one gear, a gear unit 330, a moving cam 360, and an elastic body 370.

The first conductive part 215, the second conductive part 235, and the hinge structure 300 of the electronic device shown in FIG. 6 may be the same, in whole or in part, as the first conductive part 215, the second conductive part 235, and the hinge structure 300 of the electronic device shown in FIG. 5.

According to an embodiment, inside the hinge case 310, at least part of the conductive shafts 320, part of the cam part (e.g., the moving cam 360 and the stopper cam 350), and the elastic body 370 may be received in the direction of the virtual hinge axes A1 and A2. For example, the double-axis hinge structure 300 may include two conductive shafts 320 corresponding to the two virtual rotational axes A1 and A2. The elastic bodies 370, the stopper cams 350 with at least one gear, and the insulating bushings 380 may be individually disposed on the respective conductive shafts 320. As another example, the bracket 340, the moving cam 360, and the conductive connector 390 may have two holes or openings through which the respective conductive shafts 320 pass. The conductive shafts 320 are arranged parallel to each other and may include a first conductive shaft 320a to provide a first virtual rotational axis A1 of the first housing (e.g., the first housing 211 of FIG. 5) and a second conductive shaft 320b to provide a second virtual rotational axis A2 of the second housing (e.g., the second housing 231 of FIG. 5). The components placed on the first conductive shaft 320a are described below. The same description may apply to the components placed on the second conductive shaft 320b.

According to an embodiment, the metallic bracket 340 may be disposed between both ends of the hinge case 310 of the hinge structure 300. The metallic bracket 340 may include a first metallic bracket 340a disposed at one end and a second metallic bracket 340b disposed at the opposite end. The first metallic bracket 340a and the second metallic bracket 340b may each have two through holes through which the double-axis conductive shafts (e.g., the first conductive shaft 320a and the second conductive shaft 320b) pass.

According to an embodiment, the hinge case 310 may be divided into a first area S1 and a second area S2; the first area S1 may be an area where the cam part operates, and the second area S2 may be an area where the gear unit 330 and the gear in the stopper cam 350 operate.

According to an embodiment, a look at the first area S1 reveals that part of the conductive shafts 320, the second metallic bracket 340b, the elastic bodies 370, the moving cams 360, and the cam part 352 of the stopper cam 350 may be received inside the hinge case 310. The elastic bodies 370 may expand or contract within the hinge case 310, and the cam part 352 of the stopper cam 350 may be formed to pass through the conductive shafts 320 to be rotatable. The moving cams 360 may move back and forth along the hinge shafts 320 corresponding to the rotation of the stopper cams 350.

According to an embodiment, the conductive shafts 320 may sequentially pass through the cam part 352 of the stopper cam 350, the moving cam 360, the elastic bodies 370, and the conductive connector 390. According to an embodiment, the elastic bodies 370 may be disposed in order to allow the conductive shafts 320 to pass therethrough, and may provide a force of tightly pushing the moving cams 360 and the stopper cams 350, thereby providing cam motion. The respective ends of the elastic bodies 370 may be tightly fastened to the conductive connector 390, and the respective opposite ends may remain in tight contact with the moving cams 360. The elastic bodies 370 may expand or contract in the hinge case 310, dependent upon the moving back and forth of the moving cams 360. For example, the elastic body 370 may be a compression coil spring.

According to an embodiment of the disclosure, the cam motion and configurations of the moving cam 360 and the stopper cam 350 are not limited thereto, but rather, various types of cam motion and shapes are also possible as per commonly known configurations.

According to an embodiment, a look at the second area S2 reveals that part of the conductive shafts 320, gears 351 of the stopper cams 350, the gear unit 330, and the first metallic bracket 340a may be received inside the hinge case 310. Gears 351 may be disposed in the other area than the cam part 352 of the stopper cam 350. The gear unit 330 may be disposed adjacent to the moving cams 360 and may include gears interworking with the gears 351 of the stopper cam 350. The gears 351, 331, and 333 disposed in the stopper cam 350 and the gear unit 330 may be individually formed in at least a portion of the outer circumferential surface of the stopper cam 350 and the gear unit 330.

According to an embodiment, the gear unit 330 may include a first gear 331 and a second gear 333. The first gear 331 and the second gear 333 are arranged to allow the hinge shafts 320 to pass therethrough. The virtual rotational axes A1 and A2 may be formed from the respective centers of the gears 331 and 333 towards the conductive shafts 520. For example, the first gear 331 and the second gear 333 may rotate while engaged with each other, and the center of the first gear 331 along with the first conductive shaft 320a may form part of the first virtual axis A1. The center of the second gear 333, together with the second conductive shaft 320b, may form part of the second virtual axis A2, and the second gear 333 and first gear 331 may rotate in different directions. While the electronic device 101 turns from an unfolded to folded position, the first virtual axis A1 and the second virtual axis A2 may remain parallel to each other.

According to an embodiment, the first gear 331 and the second gear 333 may be sized to have substantially the same diameter and the same number of teeth. The diameter of the first gear 331 and the second gear 333 is sized to not be larger than the thickness of the first housing 211 or second housing 231, avoiding the first and second gears 331 and 333 from protruding to the outside of the electronic device.

Figure 7:
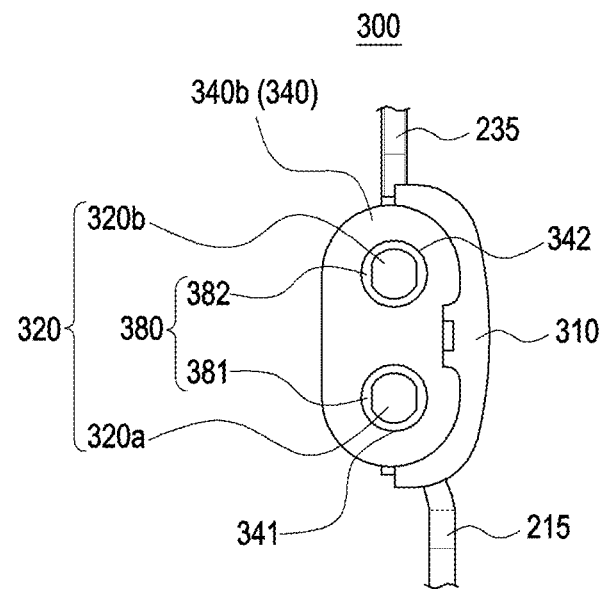
FIG. 7 is a cross-sectional view taken along line C-C' for a portion of a hinge structure 300 as shown in FIG. 6, according to an embodiment.
Figure 8:
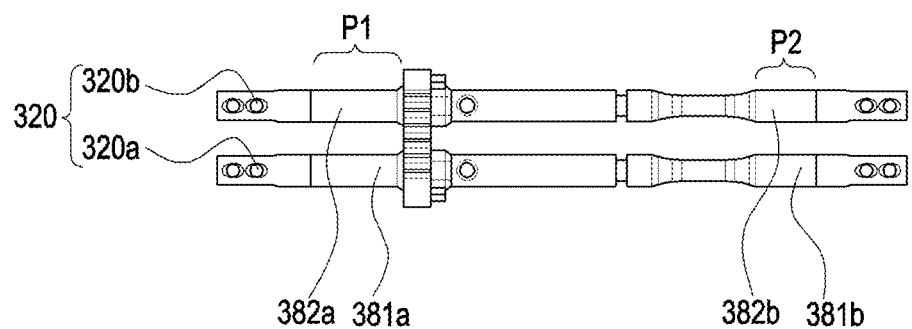
FIG. 8 is a view illustrating conductive shafts 320 with insulating bushings 380 in a hinge structure 300 according to an embodiment.

FIG. 7 is a cross-sectional view taken along line C-C' for a portion of a hinge structure 300 as shown in FIG. 6, according to an embodiment. FIG. 8 is a view illustrating conductive shafts 320 with insulating bushings 380 in a hinge structure 300 according to an embodiment.

Referring to FIG. 7, the hinge structure 300 may include a hinge case 310, a second metallic bracket 340b, conductive shafts 320a and 320b, and insulating bushings 381 and 382. A part of the hinge structure 300 of FIG. 7 may be the same, in whole or in part, as the hinge structure 300 of FIG. 6. Although the area where the second metallic bracket 340b is disposed is described in connection with FIG. 7, the same description may apply to the areas P1 and P2, where the first metallic bracket 340a and the second metallic bracket 340b are disposed in connection with FIG. 6.

According to an embodiment, the second metallic bracket 340b may be disposed inside the hinge case 310, and the second metallic bracket 340b may have a first through hole 341 and a second through hole 342 through which the conductive shafts 320a and 320b configured in a dual-axis structure may pass.

Upon charging the battery of the electronic device, electrical conduction may occur among the hinge case 310, the second metallic bracket 340b, and the conductive shafts 320, creating a current flow that may cause the user to receive an electrical shock when the user touches the hinge case 310. According to an embodiment, insulating bushings 380 may be disposed between the conductive shafts 320 and the second metallic bracket 340b to provide insulation between the conductive shafts 320 and the second metallic bracket 340b and to block a current flow to the hinge case 310.

According to an embodiment, at least part of the first insulating bushing 380a may be positioned inside the first through hole 341. For example, the first insulating bushing 381 may be disposed on the outer circumferential surface of at least part of the first conductive shaft 320a. The first insulating bushing 381 may include various members, e.g., plastic, rubber, or silicone, to block current flow and may be shaped as an empty cylinder formed to surround at least part of the first conductive shaft 320a. The first conductive shaft 320a and the first insulating bushing 381 may be produced by the same insert molding.

As another example, the second conductive shaft 320b may pass through the second through hole 342 of the second metallic bracket 340b. At least part of the second insulating bushing 382 may be positioned inside the second through hole 342. For example, the second insulating bushing 382 may be disposed on the outer circumferential surface of at least part of the second conductive shaft 320b. The second insulating bushing 382 may include various members, e.g., rubber, or silicone, to block current flow and may be shaped as an empty cylinder formed to surround at least part of the second conductive shaft 320b. The second conductive shaft 320b and the second insulating bushing 382 may be produced by the same insert molding.

Referring to FIGS. 6 and 8, the area where the insulating bushings 380 are disposed may be the portions (portions P1 and P2) where the plurality of metallic brackets 340 are disposed. The metallic brackets 340 may include the first metallic bracket 340a and the second metallic bracket 340b. The first metallic bracket 340a may be disposed in an end of the hinge case 310, and the second metallic bracket 340b may be disposed in the opposite end of the hinge case 310. The first metallic bracket 340a and the second metallic bracket 340b may be spaced apart from each other.

According to an embodiment, a first-first insulating bushing 381a may be positioned on the first portion P1 of the first conductive shaft 320a. As another example, a first-second insulating bushing 381b may be positioned on the second portion P2 of the first conductive shaft 320a. According to an embodiment, a second-first insulating bushing 382a may be positioned on the first portion P1 of the second conductive shaft 320b. As another example, a second-second insulating bushing 382b may be positioned on the second portion P2 of the second conductive shaft 320b.

According to an embodiment, the first-first insulating bushing 381a and the second-first insulating bushing 382a formed on the first portion P1 may be disposed as a pair and parallel to each other. As another example, the first-second insulating bushing 381b and the second-second insulating bushing 382b formed on the second portion P2 may be disposed as a pair and parallel to each other.

According to an embodiment, the insulating bushings 380 formed on the conductive shafts 320 may insulate the metallic bracket 340 from the conductive shafts 320, and the insulating bushings 380 may insulate between the metallic bracket 340 and the hinge case 310. The user may use the electronic device without the risk of an electric shock even while charging the electronic device.

Figure 9:
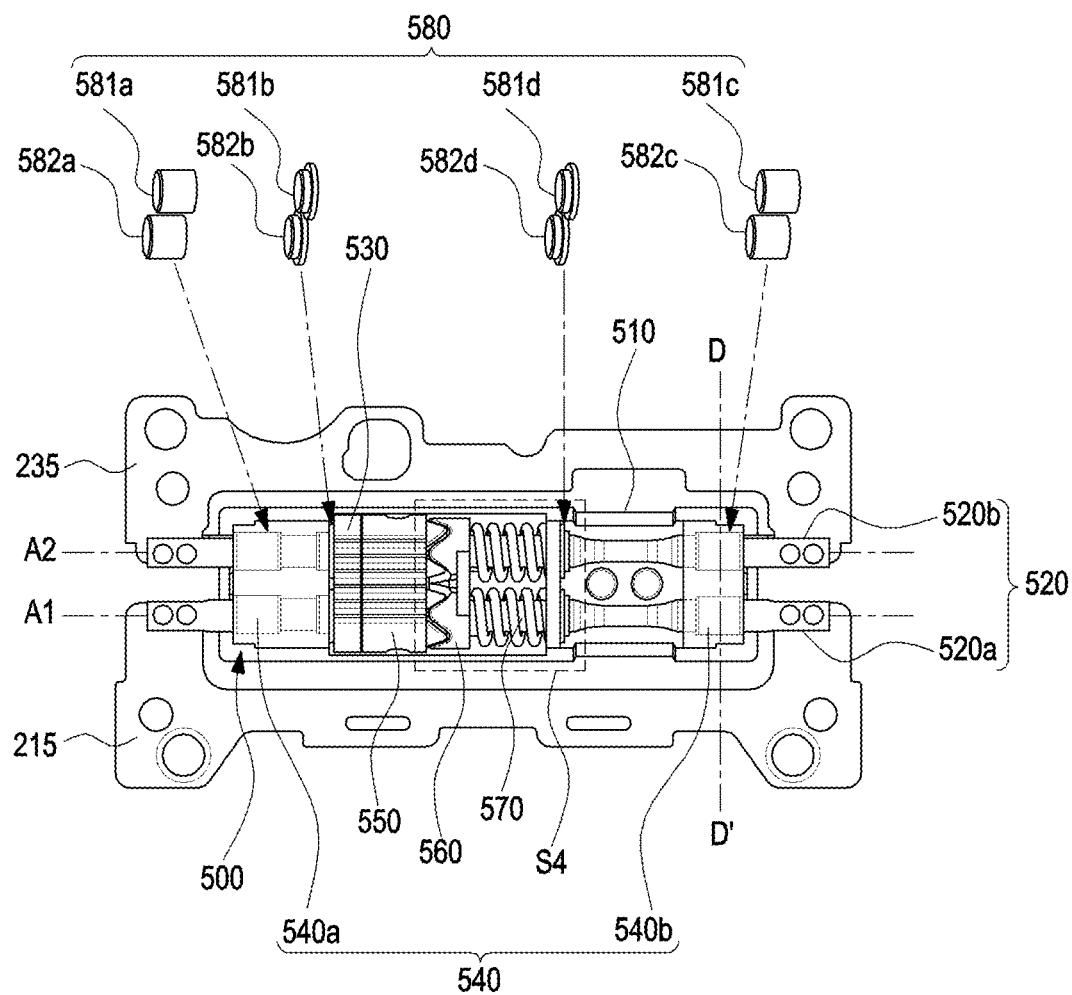
FIG. 9 is an enlarged view illustrating an internal configuration of a hinge structure 300 as shown in FIG. 5 according to an embodiment.
Figure 10:
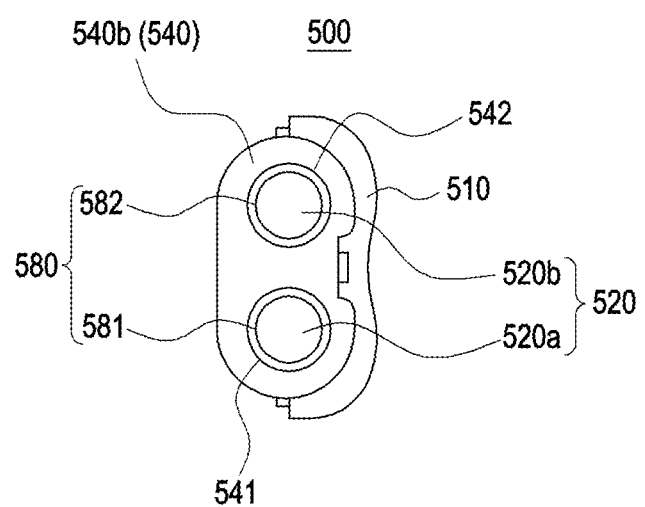
FIG. 10 is a cross-sectional view taken along line D-D' for a portion of a hinge structure 500 as shown in FIG. 9, according to an embodiment.

FIG. 9 is an enlarged view illustrating an internal configuration of a hinge structure 300 as shown in FIG. 5 according to an embodiment. FIG. 10 is a cross-sectional view taken along line D-D' for a portion of a hinge structure 500 as shown in FIG. 9, according to an embodiment.

Referring to FIGS. 9 and 10, the first housing (e.g., the first housing 211 of FIG. 5) may include a first conductive part 215. The first conductive part 215 may connect the hinge structure 500 with the first housing (e.g., the first housing 211 of FIG. 5). As another example, the second housing (e.g., the second housing 231 of FIG. 5) may include a second conductive part 235. The second conductive part 235 may connect the hinge structure 500 with the second housing (e.g., the second housing 231 of FIG. 5). For example, a portion of the first conductive part 215 may be coupled with at least one conductive shaft 520a of the hinge structure 500, and another portion of the first conductive part 215 may be connected to a surface of the first housing via a coupling member, e.g., a screw. As another example, a portion of the second conductive part 235 may be coupled with at least one conductive shaft 520b of the hinge structure 500, and another portion of the second conductive part 235 may be connected to a surface of the second housing via a coupling member, e.g., a screw.

Figure 14:
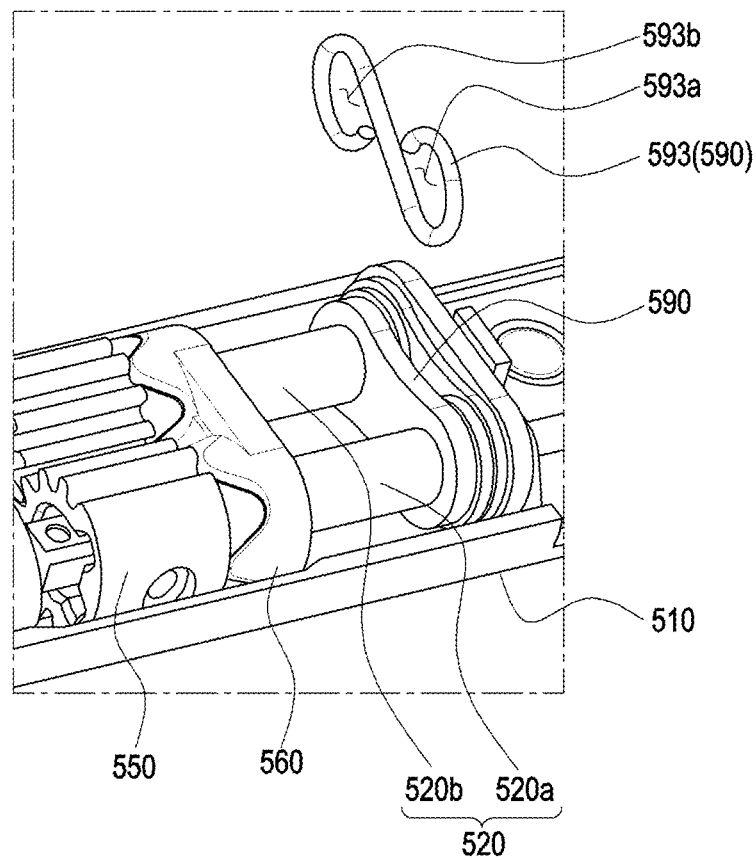
FIG. 14 is a perspective view illustrating a hinge structure 500 as shown in FIG. 13, wherein conductive shafts 520 and a conductive connector 590 are separated from each other, according to an embodiment.

According to an embodiment, the hinge structure 500 may be configured in a dual-axis structure and may include a hinge case 510, conductive shaft 520, insulating bushings 580, and a conductive connector (e.g., the conductive connector 590 of FIG. 14). As another example, the hinge structure 500 may include a stopper cam 550 with at least one gear, a moving cam 560, and elastic bodies 570.

The structure of the hinge case 510, at least one metallic bracket 540, conductive shafts 520, stopper cam 550, moving cam 560, and elastic bodies 570 of the hinge structure 500 shown in FIGS. 9 and 10 may be the same, in whole or in part, as the hinge case 310, at least one metallic bracket 340, conductive shafts 320, stopper cam 350, moving cam 360, and elastic bodies 370 of the hinge structure 300 shown in FIGS. 6 to 8.

Another embodiment of the insulating bushings 580 is described below.

Upon charging the electronic device, electrical conduction may occur among the hinge case 510, the second metallic bracket 540b, and the conductive shafts 520, creating a current flow that may cause the user to receive an electrical shock when the user touches the hinge case 510. According to an embodiment, cylindrical insulating bushings 580 may be disposed between the conductive shafts 520 and the second metallic bracket 540b to provide insulation between the conductive shafts 520 and the second metallic bracket 540b and to block a current flow.

According to an embodiment, the first conductive shaft 520a may pass through the first through hole 541 of the second metallic bracket 540b. At least part of the first insulating bushing 581 may be positioned inside the first through hole 541. For example, the first insulating bushing 581 may be disposed on the outer circumferential surface of at least part of the first conductive shaft 520*a*. The first insulating bushing 581 may include various members, e.g., rubber, or silicone, to block current flow and may be shaped as an empty cylinder formed to surround at least part of the first conductive shaft 520*a*. The first insulating bushing 581 may be produced as a separate insert-molded product from the first conductive shaft 520*a*, and the first insulating bushing 581, produced separately, may fit over a portion of the first conductive shaft 520*a*.

As another example, the second conductive shaft 520*b* may pass through the second through hole 542 of the second metallic bracket 540*b*. At least part of the second insulating bushing 582 may be positioned inside the second through hole 542. For example, the second insulating bushing 582 may be disposed on the outer circumferential surface of at least part of the second conductive shaft 520*b*. The second insulating bushing 582 may include various members, e.g., rubber, or silicone, to block current flow and may be shaped as an empty cylinder formed to surround at least part of the second conductive shaft 520*b*. The second insulating bushing 582 may be produced as a separate insert-molded product from the second conductive shaft 520*b*, and the second insulating bushing 582, produced separately, may fit over a portion of the second conductive shaft 520*b*.

According to an embodiment, the first insulating bushing 581 and the second insulating bushing 582 may be provided as a pair and spaced apart from each other. The second insulating bushing 582 may be the same in structure and shape as the first insulating bushing 581, and the same description of the first insulating bushing 581 may apply to the second insulating bushing 582.

According to an embodiment, a plurality of first insulating bushings 581 may be individually provided in multiple areas of the first conductive shaft 520*a*. For example, the areas where the first insulating bushings 581 are disposed may be at least some of the areas where the plurality of metallic brackets 540*a* and 540*b* are disposed. As another example, the first insulating bushing 581 may be disposed in some areas where the metallic brackets 540*a* and 540*b* are not disposed.

According to an embodiment, the first insulating bushing 581 may include a first-first insulating bushing 581*a*, a first-second insulating bushing 581*b*, a first-third insulating bushing 581*c*, and a first-fourth insulating bushing 581*d*, each of which is configured as an independent insert-molded product. For example, the first-first insulating bushing 581*a* and the first-second insulating bushing 581*b* may be formed inside the first metallic bracket 540*a* to surround at least part of the first conductive shaft 520*a* disposed in the first metallic bracket 540*a*. The first-first insulating bushing 581*a* and the first-second insulating bushing 581*b* may be spaced apart from each other and disposed at both ends of the first metallic bracket 540*a* to prevent the first conductive shaft 520*a* from contacting the first metallic bracket 540*a*. However, the first-first insulating bushing 581*a* and the first-second insulating bushing 581*b* are not limited to being spaced apart from each other and may be designed in different fashions that insulate the first conductive shaft 520*a* from the first metallic bracket 540*a*. For example, the first-first insulating bushing 581*a* and the first-second insulating bushing 581*b* may be produced in a single cylindrical insulating bushing without being separated from each other.

According to an embodiment, the first-third insulating bushing 581*c* may be formed inside the first metallic bracket 540*a* to surround at least a portion of the first conductive shaft 520*a* disposed in the second metallic bracket 540*b*.

According to an embodiment, the first-fourth insulating bushing 581*d* may be positioned between the first metallic bracket 540*a* and the second metallic bracket 540*b* and between the first conductive shaft 520*a* and the hinge case 510. The first-fourth insulating bushing 581*d* may cut off electrical flow to prevent the first conductive shaft 520*a* from contacting the hinge case 510.

According to an embodiment, the insulating bushings 580 positioned on the conductive shafts 520 may provide insulation between the metallic brackets 540 and the conductive shafts 520 and/or between the conductive shafts 520 and the hinge case 510. The insulating bushings 580 disposed on the conductive shafts 520 may be provided as insert-molded products separately produced and may individually fit in areas for blocking electrical flow. The user may use the electronic device without the risk of an electric shock even while charging the electronic device.

Figure 11:
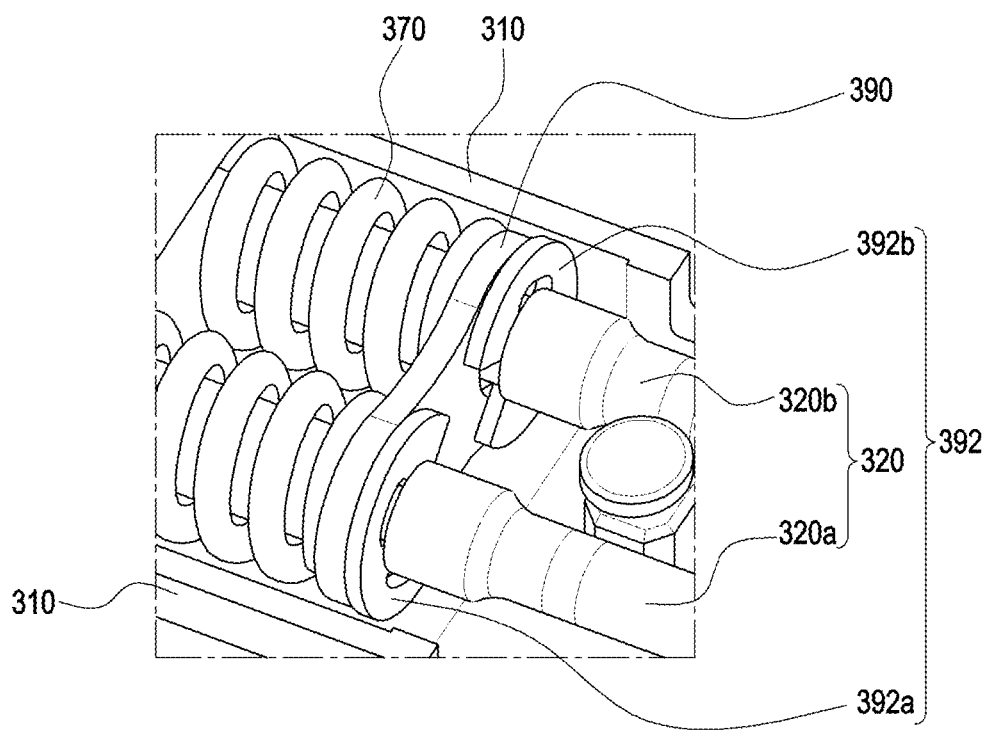
FIG. 11 is an enlarged view illustrating a portion S3 of a hinge structure 300 as shown in FIG. 6 according to an embodiment.
Figure 12:
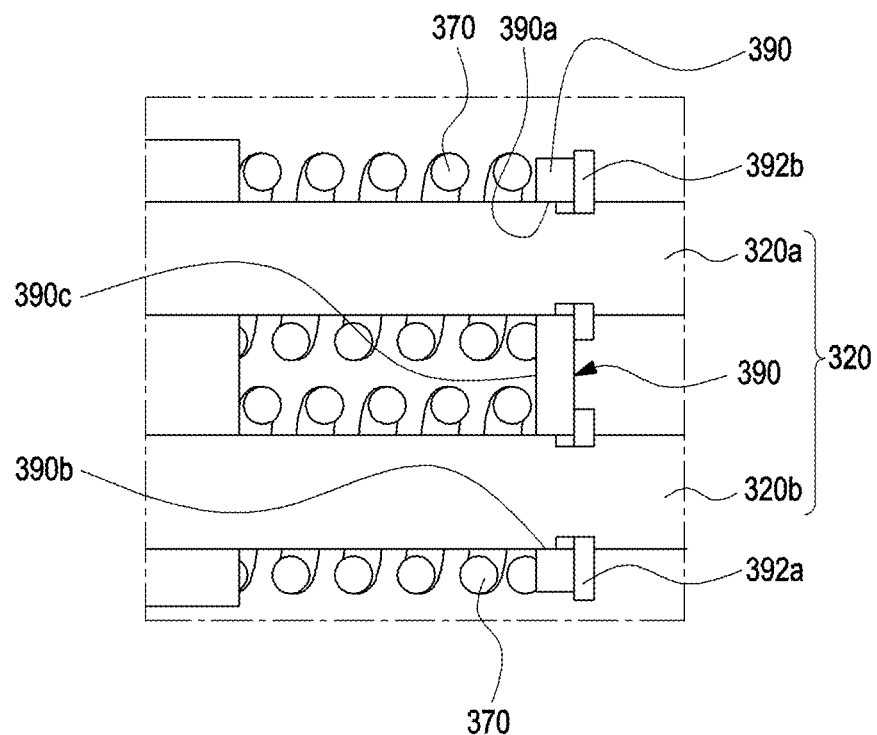
FIG. 12 is a cross-sectional view illustrating the portion S3 of FIG. 11 according to an embodiment.

FIG. 11 is an enlarged view illustrating a portion S3 of a hinge structure 300 as shown in FIG. 6 according to an embodiment. FIG. 12 is a cross-sectional view illustrating the portion S3 of FIG. 11 according to an embodiment.

Referring to FIGS. 11 and 12, the hinge structure 300 may include a hinge case 310, conductive shafts 320, elastic bodies 370, and a conductive connector 390.

The hinge case 310, conductive shafts 320, and elastic bodies 370 of the hinge structure 300 shown in FIGS. 11 and 12 may be wholly or partially the same in configuration as the hinge case 310, conductive shafts 320, and elastic bodies 370 shown in FIGS. 6 to 8.

According to an embodiment, the electronic device may include a main printed circuit board (e.g., the main printed circuit board 213 of FIG. 5) in the first housing (e.g., the first housing 211 of FIG. 5) and a sub printed circuit board (e.g., the sub printed circuit board 237 of FIG. 4) in the second housing (e.g., the second housing 231 of FIG. 5). When the main printed circuit board and the sub printed circuit board are disposed in the respective housings independently and electrically separately from each other, the ground capacity may be relatively small and arethus vulnerable to ESD or electric shocks. To address this issue, according to an embodiment, the conductive connector 390 may be provided to electrically connect the main printed circuit board and the sub printed circuit board. The placement of the conductive connector 390 may increase the ground capacity of the main printed circuit board and the sub printed circuit board. When an electrical shock occurs in the electronic device, the parts of each printed circuit board may avoid impacts by expanding the area where current flows.

According to an embodiment, there may be provided the conductive connector 390 of the hinge structure 300 and an E-ring 392 disposed adjacent to the conductive connector 390. The conductive connector 390 may be disposed to contact the conductive shafts 320 and include two through holes through which the conductive shafts 320 may pass. For example, the conductive shaft 320 may include a first hole 390*a* through which the first conductive shaft 320*a* passes, a second hole 390*b* through which the second conductive shaft 320*b* passes, and an extension 390*c* for electrically connecting the first conductive shaft 320*a* with the second conductive shaft 320*b*.

According to an embodiment, the conductive connector 390 may form an electrical path to a first conductive part (e.g., the first conductive part 215 of FIG. 5) connected with the first housing (e.g., the first housing 211 of FIG. 5) and a second conductive part (e.g., the second conductive part 235 of FIG. 5) connected with the second housing (e.g., the second housing 231 of FIG. 5). For example, the conductive connector 390 may form an electrical path formed from the first conductive part through the first conductive shaft 320a, the conductive connector 390, and the second conductive shaft 320b to the second conductive part.

According to an embodiment, the conductive connector 390 may be mounted inside the hinge case 310 and may have one side contacting the elastic bodies 370 and another side contacting the E-ring 392.

According to an embodiment, there may be provided a plurality of E-rings 392 to contact the first conductive shaft 320a and the second conductive shaft 320b. The first conductive shaft 320a may have a groove formed in the outer circumferential surface towards the inside, and one E-ring 392 may be fastened in the groove. As another example, the second conductive shaft 320b may have a groove formed in the outer circumferential surface towards the inside, and another E-ring 392 may be fastened in the groove. The plurality of E-rings 392 may prevent the conductive connector 390 from being pushed from the elastic bodies 370.

According to an embodiment, the conductive connector 390 and the E-rings 392 may be arranged to contact and electrically connect with each other on the conductive shafts 320. The elastic bodies 370 may be placed at one side of the conductive connector 390 so that the conductive connector 390 is forced in one direction, thereby allowing the electrical connection to remain stable. For example, when the user folds or unfolds the electronic device, the parts of the hinge structure may rub against each other and thus may become worn, creating a gap that may disturb the conduction of the electronic device. According to an embodiment, the structure of the conductive connector 30 supported by the elastic bodies 370 may address such disturbance and hence may allow for stable conduction of the electronic device regardless of whatever numbers the electronic device is folded or unfolded.

Figure 13:
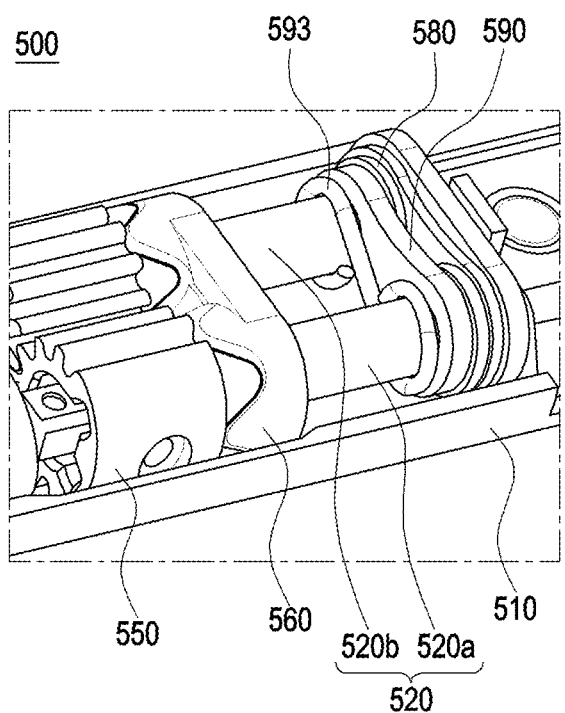
FIG. 13 is an enlarged view illustrating a portion S4 of a hinge structure 500 as shown in FIG. 9 according to an embodiment.

FIG. 13 is an enlarged view illustrating a portion S4 of a hinge structure 500 as shown in FIG. 9 according to an embodiment. FIG. 14 is a perspective view illustrating a hinge structure 500 as shown in FIG. 13, wherein conductive shafts 520 and a conductive connector 590 are separated from each other, according to an embodiment.

Referring to FIGS. 13 and 14, the hinge structure 500 may include a hinge case 510, conductive shafts 520, elastic bodies (not shown), and a conductive connector 590. For ease of description, no description is made of the elastic bodies in connection with FIGS. 13 and 14.

The hinge case 510, conductive shafts 520, stopper cam 550, and moving cam 560 of the hinge structure 500 shown in FIGS. 13 and 14 may be wholly or partially the same in configuration as the hinge case 510, conductive shafts 520, stopper cam 550, and moving cam 560 of the hinge structure 500 shown in FIGS. 9 and 10.

According to an embodiment, the electronic device may include a main printed circuit board (e.g., the main printed circuit board 213 of FIG. 5) in the first housing (e.g., the first housing 211 of FIG. 5) and a sub printed circuit board (e.g., the sub printed circuit board 237 of FIG. 4) in the second housing (e.g., the second housing 231 of FIG. 5). When the main printed circuit board and the sub printed circuit board are disposed in their respective housings independently and electrically separately from each other, the ground capacity may be relatively small and are thus vulnerable to ESD or electric shocks. To address this issue, according to an embodiment, the conductive connector 590 may be provided to electrically connect the main printed circuit board and the sub printed circuit board. The placement of the conductive connector 590 may increase the ground capacity of the main printed circuit board and the sub printed circuit board. When an electrical shock occurs in the electronic device, the parts of each printed circuit board may avoid impacts by expanding the area where current flows.

According to an embodiment, there may be provided a conductive wire 593 disposed adjacent to the conductive connector 590 of the hinge structure 500. The conductive wire 593 may be disposed to contact the conductive shafts 520 and include two openings through which the conductive shafts 520 may pass. For example, the conductive wire 593 may be produced by bending one metallic wire and may include a first opening 593a through which the first conductive shaft 520a passes and a second opening 593b through which the second conductive shaft 520b passes.

According to an embodiment, the conductive wire 393 may form an electrical path to a first conductive part (e.g., the first conductive part 215 of FIG. 5) connected with the first housing (e.g., the first housing 211 of FIG. 5) and a second conductive part (e.g., the second conductive part 235 of FIG. 5) connected with the second housing (e.g., the second housing 231 of FIG. 5). For example, the conductive connector 390 may form an electrical path formed from the first conductive part through the first conductive shaft 320a, the conductive wire 593, and the second conductive shaft 320b to the second conductive part.

Figure 15:
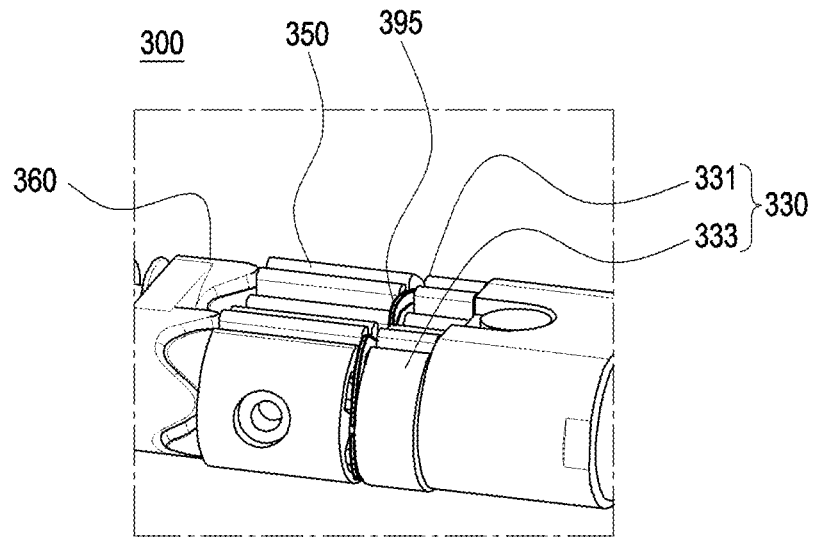
FIG. 15 is an enlarged view illustrating a portion S5 of a hinge structure 300 as shown in FIG. 6 according to an embodiment.
Figure 16:
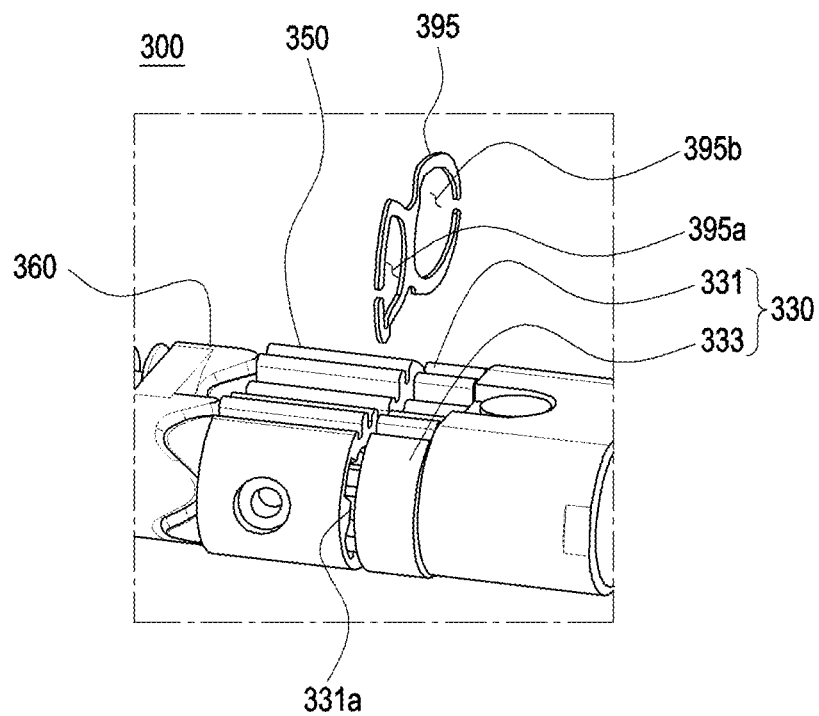
FIG. 16 is a perspective view illustrating a hinge structure 300 as shown in FIG. 15, wherein a conductive connector 390 disposed at a side of a cam part is separated, according to an embodiment.

FIG. 15 is an enlarged view illustrating a portion S5 of a hinge structure 300 as shown in FIG. 6 according to an embodiment. FIG. 16 is a perspective view illustrating a hinge structure 300 as shown in FIG. 15, wherein a conductive connector 390 disposed on a side of a cam part is separated, according to an embodiment.

Referring to FIGS. 6, 15, and 16, the hinge structure 300 may include conductive shafts 320, a stopper cam 350, a moving cam 360, a gear unit 330, and a conductive connector 390.

The conductive shafts 320, stopper cam 350, moving cam 360, and gear unit 330 of the hinge structure 300 shown in FIGS. 15 and 16 may be wholly or partially the same in configuration as the conductive shafts 320, stopper cam 350, moving cam 360, and gear unit 330 of the hinge structure 300 shown in FIG. 6.

According to an embodiment, the electronic device may include a main printed circuit board (e.g., the main printed circuit board 213 of FIG. 5) in the first housing (e.g., the first housing 211 of FIG. 5) and a sub printed circuit board (e.g., the sub printed circuit board 237 of FIG. 4) in the second housing (e.g., the second housing 231 of FIG. 5). When the main printed circuit board and the sub printed circuit board are disposed in the respective housings independently and electrically separately from each other, the ground capacity may be relatively small and are thus vulnerable to ESD or electric shocks. To address this issue, according to an embodiment, the conductive connector 390 may be provided to electrically connect the main printed circuit board and the sub printed circuit board. The placement of the conductive connector 390 may increase the ground capacity of the main printed circuit board and the sub printed circuit board. When an electrical shock occurs in the electronic device, the parts of each printed circuit board may avoid impacts by expanding the area where current flows.

According to an embodiment, in the hinge structure 300, an end of the cam part of the stopper cam 350 may be disposed to contact the moving cam 360, and the end where the gear of the stopper cam 350 is disposed may be disposed to contact the gear unit 330. The conductive connector 390 may include a conductive ground member 395. The conductive ground member 395 may be disposed between the stopper cam 350 and the gear unit 330 to provide an electrical connection between the conductive shafts 320 disposed parallel with each other.

According to an embodiment, the conductive ground member 395 may be disposed to contact the gear unit 330, which is disposed to contact the conductive shafts 320 and is thus electrically connected, and may include two openings to allow a protrusion 331a of the First Gear 331 and a protrusion of the second gear 333 in the gear unit 330 to pass therethrough. For example, the protrusion 331a of the first gear 331 may have an inside that makes contact with the first conductive shaft (e.g., the first conductive shaft 320a of FIG. 6) and an outer circumferential surface that passes through the first opening 395a of the conductive ground member 395. As another example, the protrusion of the second gear 333 may have an inside that makes contact with the second conductive shaft (e.g., the second conductive shaft 320b of FIG. 6) and an outer circumferential surface that passes through the second opening 395b of the conductive ground member 395.

According to an embodiment, the conductive ground member 395 may include a flexible conductive material and may expand the first opening 395a and fit over the protrusion 331a of the first gear 331. As another example, the conductive ground member 395 may expand the second opening 395b and fit over the protrusion of the second gear 333.

According to an embodiment, the conductive ground member 395 may form an electrical path to a first conductive part (e.g., the first conductive part 215 of FIG. 5) connected with the first housing (e.g., the first housing 211 of FIG. 5) and a second conductive part (e.g., the second conductive part 235 of FIG. 5) connected with the second housing (e.g., the second housing 231 of FIG. 5). For example, the conductive ground member 395 may form an electrical path from the first conductive part through the first conductive shaft 320a, the first gear 331, the conductive ground member 395, the second gear 333, and the second conductive shaft 320b to the second conductive part.

According to embodiments, the hinge structure of the electronic device is configured to insulate the hinge case, which directly contacts the user's skin, thus preventing the user from receiving electric shocks. In the hinge structure of the electronic device, the hinge shafts are electrically interconnected, providing a sufficient amount of ground capacity for the printed circuit boards disposed in the main body part and/or the display part.

According to an embodiment, an electronic device (e.g., the electronic device 101 of FIG. 3) may comprise a first housing structure (e.g., the first housing 211 of FIG. 3), a second housing structure, (e.g., the second housing 231 of FIG. 3), and a hinge structure (e.g., the hinge structure 300 of FIG. 3).

The hinge structure may include a metallic bracket (e.g., the metallic bracket 340 of FIG. 7) including a first conductive part (e.g., the first conductive part 215 of FIG. 3) and a second conductive part (e.g., the second conductive part 235 of FIG. 3) and a first cylindrical through hole (e.g., the first through hole 341 of FIG. 7) and a second cylindrical through hole (e.g., the second through hole 342 of FIG. 7), a first cylindrical insulating bushing (e.g., the first insulating bushing 381 of FIG. 7) at least partially positioned inside the first through hole, a second cylindrical insulating bushing (e.g., the second insulating bushing 382 of FIG. 7) at least partially positioned inside the second through hole, a first conductive shaft (e.g., the first conductive shaft 320a of FIG. 7) contacting the first conductive part and extending through the first insulating bushing, a second conductive shaft (e.g., the second conductive shaft 320b of FIG. 7) contacting the second conductive part and extending through the second insulating bushing, and a conductive connector (e.g., the conductive connector 390 of FIG. 6) contacting the first conductive shaft and the second conductive shaft and configured to form an electrical path from the first conductive part through the first conductive shaft, the conductive connector, and the second conductive shaft to the second conductive part.

According to an embodiment, the hinge structure may further include a metallic case (e.g., the hinge case 310 of FIG. 6) formed to surround the metallic bracket.

According to an embodiment, the electronic device may further comprise a screw connecting the hinge structure with the metallic case.

According to an embodiment, the metallic case may further include an insulating coating.

According to an embodiment, the electronic device may further comprise a display exposed through the first housing structure and an electrical connector (e.g., the charging terminal hole 14c of FIG. 3) exposed through the second housing structure.

According to an embodiment, the first insulating bushing may be disposed between a portion of the first conductive shaft and the metallic bracket to space the first conductive shaft apart from the metallic bracket, and the second insulating bushing may be disposed between a portion of the second conductive shaft and the metallic bracket to space the second conductive shaft apart from the metallic bracket.

According to an embodiment, the conductive connector may include a first hole through which the first conductive shaft passes, a second hole through which the second conductive shaft passes, and an extension configured to provide an electrical path of the second conductive shaft.

According to an embodiment, the electronic device may further comprise an elastic body formed to contact an end of the conductive connector and configured to provide a directional force to the conductive connector.

According to an embodiment, the first insulating bushing may be integrally formed with the first conductive shaft by insert molding, and the second insulating bushing may be integrally formed with the second conductive shaft by insert molding. The first insulating bushing and the second insulating bushing may be disposed parallel to each other.

According to an embodiment, the first insulating bushing may be formed as a separate insert-molded product from the first conductive shaft and is inserted into a plurality of portions of the first conductive shaft, and the second insulating bushing may be formed as a separate insert-molded product from the second conductive shaft and is inserted into a plurality of portions of the second conductive shaft. The first insulating bushing and the second insulating bushing may be disposed parallel to each other.

According to an embodiment, an electronic device may comprise a first housing, a second housing, and a hinge structure rotatably connecting the first housing with the second housing. The hinge structure may include a metallic bracket including a first conductive part and a second conductive part and at least one through hole, a conductive shaft passing through the at least one through hole of the metallic bracket and connected with the first conductive part or the second conductive part, and an insulating bushing disposed between at least a portion of the conductive shaft and the through hole of the metallic bracket and configured to insulate the conductive shaft from the metallic bracket.

According to an embodiment, the conductive shaft may include a first conductive shaft connected with the first housing and a second conductive shaft connected with the second housing. The electronic device may further comprise a conductive connector disposed to contact the first conductive shaft and the second conductive shaft and electrically connecting the first conductive shaft with the second conductive shaft.

According to an embodiment, the electronic device may further comprise a hinge case configured to seat the metallic bracket and that includes a coating configured to prevent corrosion to an outer surface thereof. The insulating bushing may be formed to surround at least part of the first conductive shaft or the second conductive shaft.

According to an embodiment, the electronic device may further comprise a first circuit board mounted in the first housing and a second circuit board mounted in the second housing. The first circuit board and the second circuit board may be electrically connected through the conductive connector.

According to an embodiment, the metallic bracket may include a first metallic bracket and a second metallic bracket spaced apart from the first metallic bracket. The insulating bushing may be separately disposed in a through hole of the first metallic bracket and a through hole of the second metallic bracket.

According to an embodiment, the electronic device may further comprise a stopper cam, a moving cam, and a gear unit sequentially arranged on an outer circumferential surface of the conductive shaft. The conductive connector may be disposed between the stopper cam and the gear unit and contacts at least part of the gear unit to provide an electrical contact.

According to an embodiment, the hinge structure may further include a hinge case formed to surround the metallic bracket, and a screw connecting the hinge structure with the hinge case.

According to an embodiment, the electronic device may further comprise an elastic body formed to contact an end of the conductive connector and configured to provide a force to the conductive connector in a direction.

According to an embodiment, an electronic device may comprise a first housing, a second housing, and a hinge structure rotatably connecting the first housing with the second housing. The hinge structure may include a metallic bracket including a first conductive part and a second conductive part and a first through hole and a second through hole, a first conductive shaft passing through the first through hole of the metallic bracket and connected with the first conductive part, a second conductive shaft passing through the second through hole of the metallic bracket and connected with the second conductive part, and a conductive connector contacting the first conductive shaft and the second conductive shaft and electrically connecting the first conductive shaft with the second conductive shaft.

According to an embodiment, the electronic device may further comprise a first circuit board mounted in the first housing and a second circuit board mounted in the second housing. The first circuit board and the second circuit board may be electrically connected through the conductive connector.

According to an embodiment, the conductive connector may include a first hole through which the first conductive shaft passes, a second hole through which the second conductive shaft passes, and an extension configured to provide an electrical path of the second conductive shaft.

According to an embodiment, a hinge structure may comprise a metallic bracket including first cylindrical through hole and a second cylindrical through hole, a first cylindrical insulating bushing at least partially positioned inside the first through hole, a second cylindrical insulating bushing at least partially positioned inside the second through hole, a first conductive shaft extending through the first insulating bushing, a second conductive shaft extending through the second insulating bushing, and a conductive connector contacting the first conductive shaft and the second conductive shaft and configured to form an electrical path through the first conductive shaft, the conductive connector, and the second conductive shaft.

According to an embodiment, the electronic device may further comprise a metallic case formed to surround the metallic bracket.

As is apparent from the foregoing descrition, according to various embodiments, in the hinge structure and the electronic device with the hinge structure, the case directly contacting the user's skin may be configured to be insulated, thus preventing the user from receiving an electric shock when the user touches the outer surface of the electronic device, e.g., upon holding the electronic device when making a call while charging the electronic device.

According to various embodiments, in the hinge structure and the electronic device with the hinge structure, the case of the hinge structure may be insulated, and the hinge shafts may be interconnected, thereby providing a sufficient ground capacity for the printed circuit boards disposed in the main body part and/or the display part. The sufficient ground capacity allows for efficient hardware (H/W) capability (e.g., satisfactory ESD or wireless communication sensitivity) of the electronic device.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device, comprising:
a first housing structure;
a second housing structure; and
a hinge structure comprising:
   a metallic bracket including a first conductive part, a second conductive part, a first cylindrical through hole, and a second cylindrical through hole;
   a first cylindrical insulating bushing at least partially positioned inside the first cylindrical through hole;
   a second cylindrical insulating bushing at least partially positioned inside the second cylindrical through hole, wherein the second cylindrical insulating bushing is disposed in parallel and apart from the first cylindrical insulating bushing;
   a first conductive shaft contacting the first conductive part and extending through the first insulating bushing;
   a second conductive shaft contacting the second conductive part and extending through the second insulating bushing; and
   a conductive connector contacting the first conductive shaft and the second conductive shaft and configured to form an electrical path from the first conductive part to the second conductive part through the first conductive shaft, the conductive connector, and the second conductive shaft.

2. The electronic device of claim 1, wherein the hinge structure further includes a metallic case formed to surround the metallic bracket.

3. The electronic device of claim 2, further comprising a screw connecting the hinge structure with the metallic case.

4. The electronic device of claim 2, further comprising an insulating coating on the metallic case.

5. The electronic device of claim 1, further comprising:
a display exposed through the first housing structure; and
an electrical connector exposed through the second housing structure.

6. The electronic device of claim 1, wherein:
the first insulating bushing is disposed between a portion of the first conductive shaft and the metallic bracket to space the first conductive shaft apart from the metallic bracket, and
the second insulating bushing is disposed between a portion of the second conductive shaft and the metallic bracket to space the second conductive shaft apart from the metallic bracket.

7. The electronic device of claim 1, wherein the conductive connector includes a first hole through which the first conductive shaft passes, a second hole through which the second conductive shaft passes, and an extension configured to provide an electrical path of the second conductive shaft.

8. The electronic device of claim 7, further comprising an elastic body formed to contact an end of the conductive connector and configured to provide a force to the conductive connector in a direction.

9. The electronic device of claim 6, wherein:
the first insulating bushing is integrally formed with the first conductive shaft by insert molding,
the second insulating bushing is integrally formed with the second conductive shaft by insert molding, and
the first insulating bushing and the second insulating bushing are disposed parallel with each other.

10. The electronic device of claim 6, wherein:
the first insulating bushing is formed as a separate insert-molded product from the first conductive shaft and is inserted into a plurality of portions of the first conductive shaft,
the second insulating bushing is formed as a separate insert-molded product from the second conductive shaft and is inserted into a plurality of portions of the second conductive shaft, and
the first insulating bushing and the second insulating bushing are disposed parallel with each other.

11. An electronic device, comprising:
a first housing;
a second housing; and
a double-axis hinge structure rotatably connecting the first housing with the second housing, the double-axis hinge structure including:
a metallic bracket including a first conductive part, a second conductive part, and at least one through hole:
a conductive shaft passing through the at least one through hole of the metallic bracket and connected with the first conductive part or the second conductive part; and
an insulating bushing disposed between at least a portion of the conductive shaft and the through hole of the metallic bracket and configured to insulate the conductive shaft from the metallic bracket;
wherein the double-axis hinge structure further includes: a hinge case formed to surround the metallic bracket; and a screw connecting the double-axis hinge structure with the hinge case.

12. The electronic device of claim 11, wherein:
the conductive shaft includes a first conductive shaft connected with the first housing and a second conductive shaft connected with the second housing, and
the electronic device further comprises a conductive connector disposed to contact the first conductive shaft and the second conductive shaft and electrically connect the first conductive shaft with the second conductive shaft.

13. The electronic device of claim 12, further comprising a hinge case configured to seat the metallic bracket and including a coating configured to prevent corrosion to an outer surface thereof,
wherein the insulating bushing is formed to surround at least part of the first conductive shaft or the second conductive shaft.

14. The electronic device of claim 13, further comprising:
a first circuit board mounted in the first housing; and
a second circuit board mounted in the second housing,
wherein the first circuit board and the second circuit board are electrically connected through the conductive connector.

15. The electronic device of claim 14, wherein:
the metallic bracket includes a first metallic bracket and a second metallic bracket spaced apart from the first metallic bracket, and
the insulating bushing is separately disposed in a through hole of the first metallic bracket and a through hole of the second metallic bracket.

16. The electronic device of claim 12, further comprising a stopper cam, a moving cam, and a gear unit sequentially arranged on an outer circumferential surface of the conductive shaft,
wherein the conductive connector is disposed between the stopper cam and the gear unit and contacts at least part of the gear unit to provide an electrical contact.

17. The electronic device of claim 12, further comprising an elastic body formed to contact an end of the conductive connector and configured to provide a force to the conductive connector in a direction.

18. A hinge structure, comprising:
a metallic bracket including a first cylindrical through hole and a second cylindrical through hole;
a first cylindrical insulating bushing at least partially positioned inside the first cylindrical through hole;
a second cylindrical insulating bushing at least partially positioned inside the second cylindrical through hole, wherein the second cylindrical insulating bushing is disposed in parallel and apart from the first cylindrical insulating bushing;
a first conductive shaft extending through the first insulating bushing;
a second conductive shaft extending through the second insulating bushing; and
a conductive connector contacting the first conductive shaft and the second conductive shaft and configured to form an electrical path through the first conductive shaft, the conductive connector, and the second conductive shaft.

19. The hinge structure of claim 18, further comprising a metallic case formed to surround the metallic bracket.

* * * * *